United States Patent
Sasaki et al.

(10) Patent No.: US 7,320,925 B2
(45) Date of Patent: Jan. 22, 2008

(54) SOI SUBSTRATE, SEMICONDUCTOR SUBSTRATE, AND METHOD FOR PRODUCTION THEREOF

(75) Inventors: Tsutomu Sasaki, Hikari (JP); Seiji Takayama, Hikari (JP); Atsuki Matsumura, Hikari (JP)

(73) Assignee: Siltronic AG, Munich (DE)

( * ) Notice: Subject to any disclaimer, the term of this patent is extended or adjusted under 35 U.S.C. 154(b) by 327 days.

(21) Appl. No.: 10/858,646

(22) Filed: Jun. 2, 2004

(65) Prior Publication Data

US 2004/0253793 A1  Dec. 16, 2004

(30) Foreign Application Priority Data

Jun. 13, 2003  (JP) ............................. 2003-170093
Sep. 25, 2003  (JP) ............................. 2003-333908

(51) Int. Cl.
H01L 21/84  (2006.01)
(52) U.S. Cl. ................. 438/407; 257/E21.561
(58) Field of Classification Search ................ 438/407, 438/149; 257/E21.561
See application file for complete search history.

(56) References Cited

U.S. PATENT DOCUMENTS

| | | | |
|---|---|---|---|
| 5,346,841 A * | 9/1994 | Yajima | 438/295 |
| 5,399,507 A | 3/1995 | Sun | |
| 5,488,004 A | 1/1996 | Yang | |
| 5,753,923 A | 5/1998 | Mera et al. | |
| 6,548,369 B1 | 4/2003 | Van Bentum | |
| 6,767,801 B2 | 7/2004 | Kawamura et al. | |
| 2004/0171228 A1 * | 9/2004 | Matsumura et al. | 438/407 |
| 2004/0224477 A1 * | 11/2004 | Erokhin et al. | 438/407 |

FOREIGN PATENT DOCUMENTS

| | | |
|---|---|---|
| JP | 8-176694 | 1/1996 |
| JP | 02218159 A | 11/2000 |
| JP | 2001308025 A | 4/2002 |
| TW | 505 993 | 10/2002 |
| WO | 00/48245 A | 8/2000 |

OTHER PUBLICATIONS

Patent Abstract of Japan Corresponding to JP2001-308025.
Patent Abstract of Japan Corresponding to JP2001-308172.

* cited by examiner

*Primary Examiner*—Richard A. Booth
(74) *Attorney, Agent, or Firm*—Brooks Kushman P.C.

(57) ABSTRACT

A method is for commercially producing by the SIMOX technique a perfect partial SOI structure avoiding exposure of a buried oxide film through the surface thereof and forming no step between an SOI region and a non-SOI region.

A method for the production of an SOI substrate, includes forming on the surface of a semiconductor substrate made of a silicon single crystal a protective film designated to serve as a mask for ion implantation, forming an opening part of a stated pattern in the protective film, implanting oxygen ions into the surface of the semiconductor substrate in a direction not perpendicular thereto, and heat treating the semiconductor substrate thereby forming a buried oxide film in the semiconductor substrate, and inducing at the step of implanting oxygen ions into the surface of the semiconductor substrate the impartation of at least two angles to be formed between the projection of the flux of implantation of oxygen ions and a specific azimuth of the main body of the substrate.

17 Claims, 4 Drawing Sheets

Fig. 1A
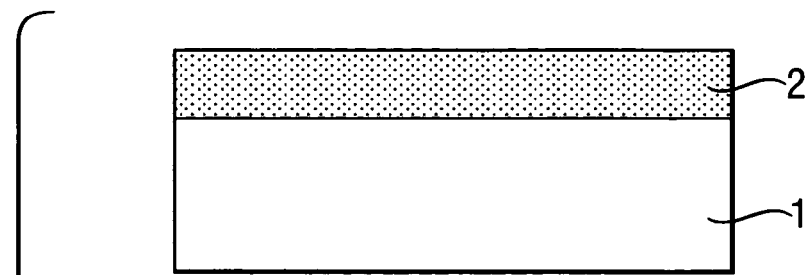
Fig. 1B
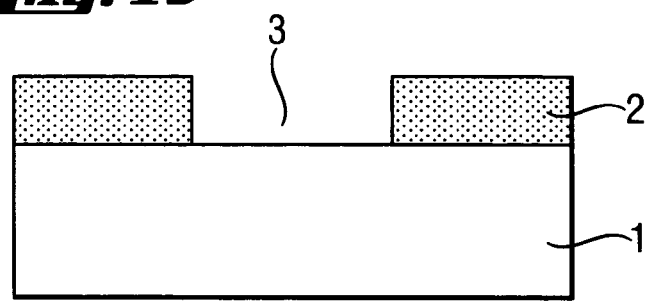
Fig. 1
Fig. 1C
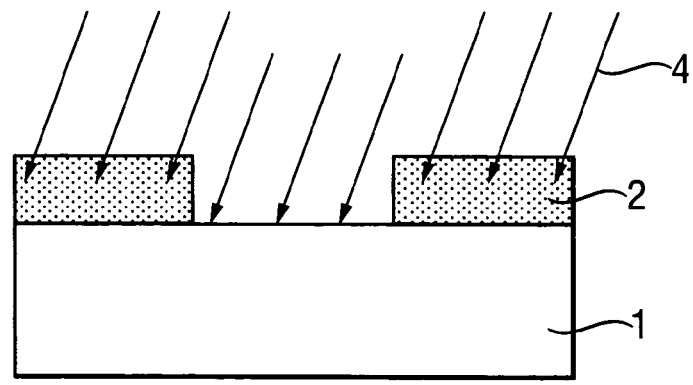
Fig. 1D
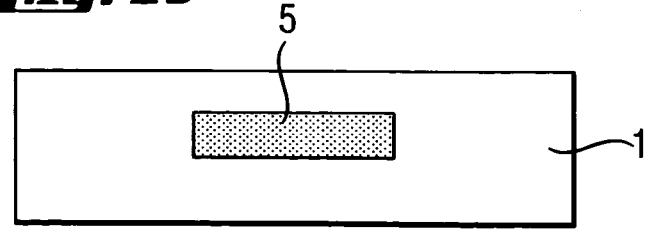

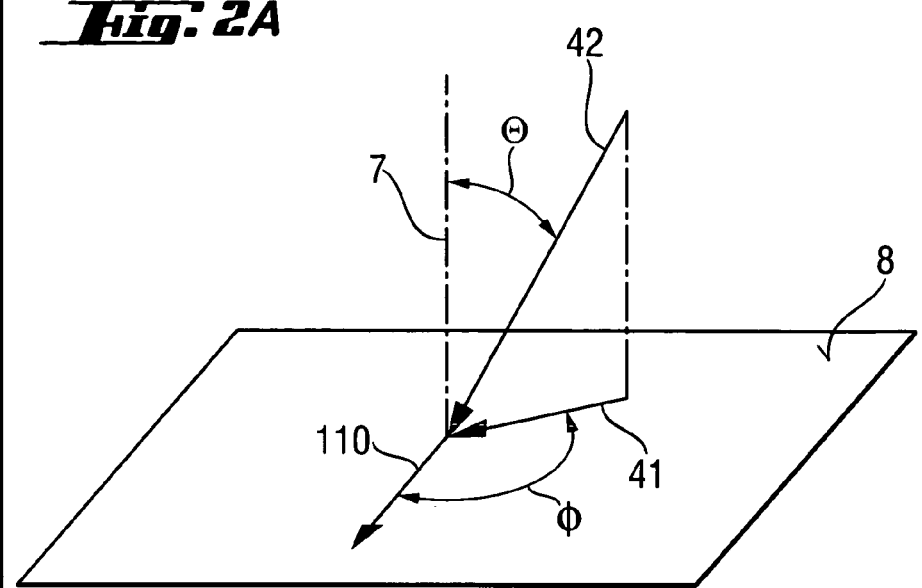
IMPLANTATION CONDITION α
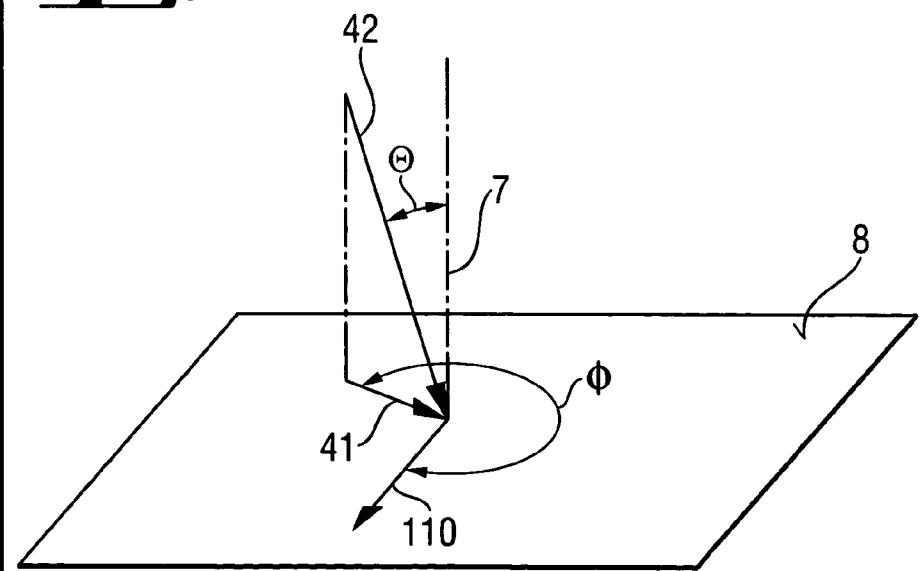
IMPLANTATION CONDITION β

SOI SUBSTRATE, SEMICONDUCTOR SUBSTRATE, AND METHOD FOR PRODUCTION THEREOF

CROSS REFERENCE TO RELATED APPLICATIONS

Priority is claimed under 35 U.S.C. §119 of Japan Application No. 2003-170093 filed Jun. 13, 2003 and Japan Application No. 2003-333908 filed Sep. 25, 2003.

BACKGROUND OF THE INVENTION

1. Field of the Invention

The present invention relates to partial SOI substrate having an SOI (silicon-on-insulator) structure element manufactured by the SIMOX (separation by implanted oxygen) technique and a bulk structure element mounted as mixed thereon and a method for the production of a partial SOI substrate.

2. The Prior Art

Heretofore, in the production of a partial SOI by the SIMOX, it has been customary to inject oxygen ions in a fixed direction to the opening part of a mask owing to the construction of an ordinary SIMOX grade ion implanter.

Specifically, this procedure has been directed to accomplishing the formation of a buried oxide film 5 by implanting oxygen ions into the surface of the substrate through an opening part 3 formed in a protective film 2 by lithography, subjecting the affected substrate to a prescribed washing treatment, and performing a heat treatment at an elevated temperature thereon (refer to Patent Document 1 and Patent Document 2).

In these Patent Documents 1 and 2, the idea of inclining the implantation by an angle of about 7 degrees relative to the normal of the surface of the substrate is introduced. This inclination is aimed at adjusting the distribution of implanted oxygen ions thereby ensuring formation of a perfect buried oxide film. This inclined ion implantation, however, results in exposing the edge of the buried oxide film through the surface (refer to Patent Document 2 and Patent Document 3). The reason offered to explain this phenomenon is that since the part embracing the opening part is not thoroughly shielded against ions by the protective film as illustrated in FIG. 4 and oxygen ions are inevitably implanted into the surface of the substrate. The buried oxide film is eventually exposed to the surface when the buried oxide film is formed by the heat treatment. Since this exposed part inevitably results in forming a dent or a cavity in the subsequent step of removing the oxide film by washing the surface with hydrofluoric acid, it constitutes a hindrance to the circuit design. This is due to necessitating the incorporation of a device-isolation structure without fail and poses a problem regarding the aspect of the process as by entailing the occurrence of excess slurry in the step of CMP.

Patent Document 2 and Patent Document 3 propose measures for the solution of these problems. These measures, however, are not easily applied to actual commercial production.

The perpendicular implantation proposed in Patent Document 2 interferes with the formation of BOX and degrades the quality of the BOX because the channeling gives rise to a tail in the distribution of implanted oxygen. The anisotropic etching performed at an inclination of 7-10 degrees from the normal of the surface of the substrate as proposed in Patent Document 3 permits no easy control. This is because even the ECR method adopts a principle of causing the potential difference between the plasma and the substrate to occur in a direction perpendicular to the surface of the substrate. The idea of utilizing the resonance point fails to secure the directional property because the inclination gives rise to a deviation. The process using a nitride film is at a disadvantage in increasing the number of stages of work, elongating the time of work, and adding to the cost of production.

The partial SOI proposed to date inevitably results in a step between the SOI region and the non-SOI region. No procedure has yet been proposed for the solution of this problem and no effort has been made with the object of exploring the clear existence of this problem. The tolerated step depends on the circuit pattern dimensioning of a target integrated circuit. Although it is said to be not more than 200 nm or thereabout, the magnitude of the allowable step tends to decrease.

Official gazette of JP-A-08-017694 [Patent Document 1]
Official gazette of JP-A-2001-308025 [Patent Document 2]
Official gazette of JP-A-2001-308172 [Patent Document 3]

Heretofore, in the production of a partial SOI substrate by the SIMOX technique, the ordinary method inevitably requires the exposure of BOX and several measures proposed for the solution of this problem invariably encounter difficulty in achieving commercial utilization.

SUMMARY OF THE INVENTION

The present invention has an object directed toward providing a method for producing a perfect partial SOI structure free from exposure of a buried oxide film by the SIMOX technique commercially and inexpensively and an SOI substrate produced by the method. Further, the present invention is directed to providing a method of production which is capable of avoiding the occurrence of a problematic step between the SOI region and the non-SOI region and an SOI substrate produced by the method.

The above object is accomplished by an SOI substrate which is furnished in a semiconductor substrate made of a silicon single crystal with a buried oxide film, characterized by imparting a surface height difference of not more than 200 nm between the SOI region having a buried oxide film and the non-SOI region having no buried oxide film.

The above object is also accomplished by an SOI substrate produced by a method for production comprising a step of forming on the surface of a semiconductor substrate made of a silicon single crystal a protective film designated to serve as a mask for ion implantation, a step of forming an opening part of a stated pattern in said protective film, a step of implanting oxygen ions into the surface of said semiconductor substrate in a direction not perpendicular thereto, and a step of heat treating the semiconductor substrate thereby forming an buried oxide film in said semiconductor substrate, characterized by having a surface height difference of not more than 200 nm between an SOI region having the buried oxide film and a non-SOI region having no buried oxide film.

The above object is additionally accomplished by a method for the production of an SOI substrate, comprising a step of forming on the surface of a semiconductor substrate made of a silicon single crystal a protective film designated to serve as a mask for ion implantation, a step of forming an opening part of a stated pattern in said protective film, a step of implanting oxygen ions into the surface of said semiconductor substrate in a direction not perpendicular thereto, and a step of heat treating the semiconductor substrate thereby forming a buried oxide film in said semiconductor substrate, characterized by inducing at the step of implanting oxygen ions into the surface of said semiconductor substrate the impartation of at least two angles to be formed between the projection of the flux of implantation of oxygen ions and a specific azimuth of the main body of the substrate.

By the present invention, a method for producing a perfect partial SOI structure avoiding exposure of a buried oxide film through the surface by the SIMOX technique commercially and inexpensively and an SOI substrate produced by the method are obtained as described above.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawing, wherein similar reference characters denote similar elements throughout the several views:

FIG. 1 is a flow diagram showing one example of the process for the production of an SOI substrate according to this invention;

FIG. 2 is a cross section showing one example of a step of implantation of ions in the process for the production of an SOI substrate according to this invention;

DETAILED DESCRIPTION OF PREFERRED EMBODIMENTS

Figure 3:
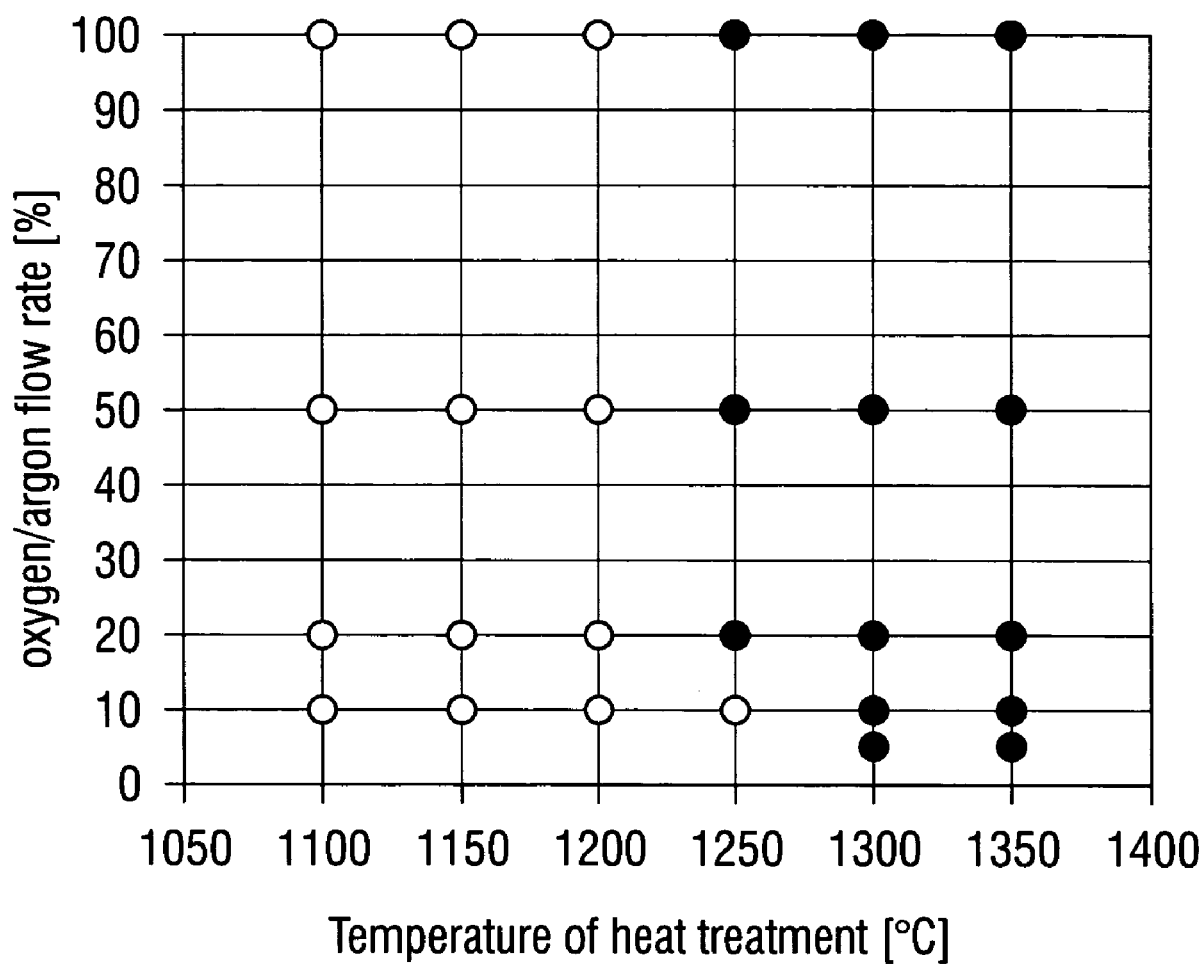
FIG. 3 is a phase diagram illustrating the conditions of heat treatment and the successful or unsuccessful elimination of a step between the SOI/bulk regions in the process for the production of an SOI substrate according to this invention.
Figure 4:
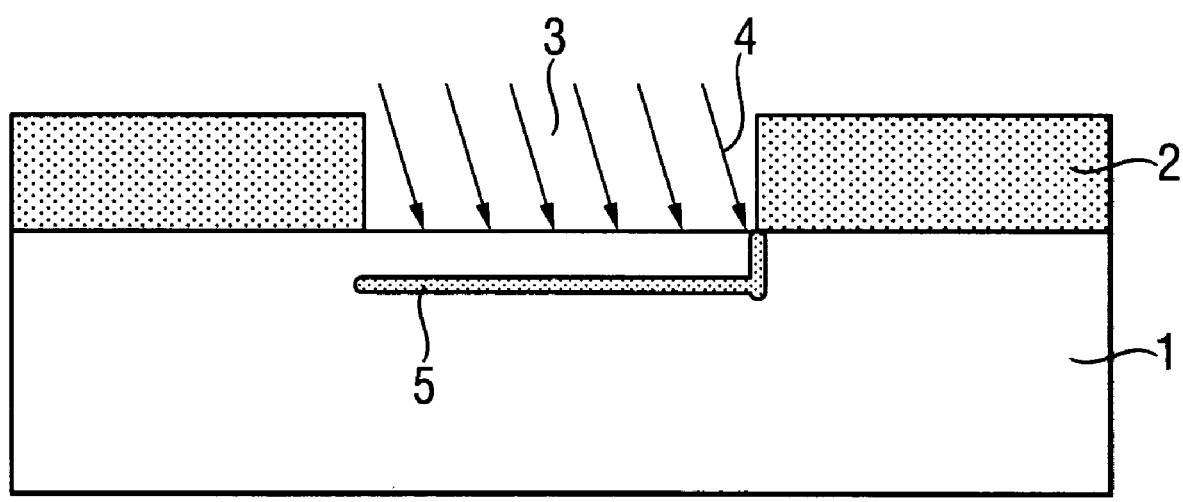
FIG. 4 is a cross section illustrating the characteristics of the process for the production of an SOI substrate according to the conventional technique.

Turning now in detail to the drawings, FIGS. 1(A), (B), (C), and (D) are flow diagrams illustrating one example of the process for producing an SOI substrate according to this invention. The following description will presume the case of using a thermal oxide film as the protective film.

With reference to FIG. 1(A), an oxide film which is a protective film 2 designated to serve as a mask against ion implantation is formed by thermal oxidation on the surface of a semiconductor substrate 1 made of a silicon single crystal. Then, as shown in FIG. 1(B), an opening part 3 having a stated pattern is formed by the lithographic technique in the protective film 2. Further, as illustrated in FIG. 1(C), oxygen ions 4 are implanted into the surface of the semiconductor substrate 1 in a direction not perpendicular to the surface thereby heat-treating the semiconductor substrate 1 and forming an buried oxide film 5 in the semiconductor substrate 1 as illustrated in FIG. 1(D).

At this time, the opening part 3 is preferred to be transformed by anisotropic etching into a mask having distal parts thereof formed at an angle approximating close to a perpendicular to the substrate.

The SOI substrate by the SIMOX technique is manufactured by a process which comprises implanting oxygen ions in a dose of $4 \times 10^{17}$ atoms/cm$^2$ with an accelerating energy of 180 keV until a high concentration oxygen ion implanted layer is formed in a prescribed depth, annealing the layer for four hours in an atmospheric gas of Ar incorporating oxygen in a concentration of 0.5% at an annealing temperature of 1350° C., and further annealing it for four hours with the oxygen concentration increased to 70%. The conditions for the production of the SIMOX substrate, however, do not need to be particularly limited thereto.

Here, the semiconductor substrate is formed of either Si or SiGe.

For example, by varying the angle $\phi$ formed between the azimuth [110], of the substrate and the projection 41 of the flux 42 of implantation of oxygen ions to the plane of the substrate to those of the conditions $\alpha$ and $\beta$ as illustrated in FIG. 2(A) and FIG. 2(B), it is possible to make uniform the screening of ions at the distal parts of the opening part in the mask by virtue of the protective film.

The present invention is also directed to a method for the production of the aforementioned SOI substrate such that the implantation at the step of implanting oxygen ions into the surface of the semiconductor substrate with the protective film as the mask is performed as split into a plurality of cycles. The angles formed between the projection of the flux of implantations of oxygen ions to the plane of the substrate and the specific azimuth of the main body of the substrate are differentiated between the splits.

When the aforementioned angle $\phi$ cannot be freely set during the course of the implantation, by performing the implantation as split into a plurality of cycles and varying the angle $\phi$ in each split cycle, it is possible to make uniform the screening of ions at the distal parts of the opening part in the mask by virtue of the protective film.

The present invention also provides a method for the production of the aforementioned SOI substrate such that the angle formed at the step of implanting oxygen ions 4 to the surface of the semiconductor substrate 1 with the protective film 2 as the mask between the flux 42 of implantations of oxygen ions and the normal 7 of the surface of the main body of the substrate is not less than 10 degrees. Preferably this angle is within the range of 11-16 degrees.

When the angle $\theta$ formed between the flux 42 of implantations of oxygen ions 4 and the normal 7 of the surface of the main body 1 of the aforementioned substrate (refer to FIG. 2) is not less than 10 degrees, the repression of the exposure of the buried oxide film can be attained more effectively than when the angle is less than 10 degrees.

The foregoing description of this invention can be applied to the case of forming an buried insulating film, an buried cavity, or an buried silicon compound film such as SiC or $Si_3N_4$ by the ion implantation and the heat treatment, which is capable of preventing the exposure of the buried layer or cavity as well.

Further, this invention is directed to a method for the production of the aforementioned SOI substrate such that the aforementioned step of heat treatment embraces such a step of heat treatment as uses a temperature of not less than 1250° C., preferably not less than 1300° C., and more preferably not less than 1325° C., an oxygen flow rate of not less than 5%, preferably not less than 20%, and a duration of not less than 10 minutes, preferably not less than 30 minutes.

The percent of oxygen flow rate is based upon the total volume of gas in the flow rate of gas.

By having this step of heat treatment incorporated into the process, it is made possible to eliminate the step between the SOI/bulk regions.

The present invention is further directed to a method for the production of the aforementioned SOI substrate which has the film of silicon oxide formed as the protective film 2.

Though the protective film is only required to be capable of intercepting oxygen-ions, the use of the film of silicon oxide allows the production of the SOI substrate to be effected under broader conditions (refer to Table 1).

Thus, the present invention provides an SOI substrate produced by the method described above, characterized by the fact that the buried oxide film is not exposed through the surface of the substrate and the step between the SOI/bulk regions is not more than 200 nm.

EXAMPLES

The present invention will now be described specifically below with reference to examples.

Examples 1 to 17 and Controls 1 to 5

A wafer having a (001) plane as the main surface of substrate and measuring 200 mm in diameter was prepared by growing a boron-doped single crystal silicon in accordance with the Czochralski method. The implantation of oxygen ions was carried out under the conditions of 550° C. in substrate temperature, 180 keV in accelerated voltage, and $4\times10^{17}$ cm$^{-2}$ in total dose of implantation. In the working examples of this invention, the implantation was split into four cycles each using a dose of $1\times10^{17}$ cm$^{-2}$. Each wafer contained in the outer periphery thereof in the <110> direction such notches as served to indicate bearings. The angle φ formed in each split cycle between the projection of the flux of implantations and the <110> direction was rotated by 90 degrees per cycle. The angle φ was fixed during each split cycle of implantation. The angle θ formed between the normal of the surface of the substrate and the flux of implantations in each split cycle was fixed at 15 degrees. A partial SOI was produced by altering the angle φ by one degree at a time between 10-16 degrees by following the same procedure as described above. Separately, a partial SOI was produced by splitting the implantation into two cycles and altering the angle θ at an interval of 180 degrees in each split cycle and splitting the implantation into three cycles and altering the angle θ at an interval of 120 degrees in each cycle. For comparative examples, the implantation was carried out under such conditions as shown in Table 1 which included exclusion of splitting in the implantation. These wafers were placed in a heat-treating furnace and subjected to a heat treatment therein under the following two conditions.

Condition A: Temperature 1350° C., atmosphere argon+ 0.5% oxygen, heating time four hours.

Condition B: Temperature 1350° C., atmosphere argon+ 0.5% oxygen, heating time four hours followed by a heat treatment using the conditions of 1350° C. in temperature, argon+70% oxygen in atmosphere, and three hours in heating time.

The partial SOI wafers consequently produced were stripped of a surface oxide layer with hydrofluoric acid and tested by the use of a spectroscopic ellipsometry for the thicknesses of a surface silicon layer and an buried oxide layer in the SOI part. As a result, no large difference was found among the samples. Depending on the conditions of heat treatment, the samples of Condition A were found to measure 340 nm in the thickness of surface silicon and 85 nm in the thickness of buried oxide layer and the samples of Condition B were found to measure 175 nm in the thickness of surface silicon layer and 105 nm in the thickness of buried oxide layer.

Then, the surface of the SOI/bulk boundary was observed by the use of an atomic force microscope (AFM). The results of the observation are collectively shown in Table 1. The samples were rated for the exposure of BOX in the SOI/bulk boundary. The results are rated on a three-point scale, wherein S denotes total absence of observation, P denotes a case of partial observation, and F denotes a case of exposure throughout the whole boundary.

TABLE 1

| | Number of splits | Angle θ | Protective film | SOI/bulk boundary |
|---|---|---|---|---|
| Example 1 | 4 | 15 | SiO$_2$ | S |
| Example 2 | 4 | 15 | Si$_3$N$_4$ | S |
| Example 3 | 3 | 15 | SiO$_2$ | S |
| Example 4 | 3 | 15 | Si$_3$N$_4$ | S |
| Example 5 | 2 | 15 | SiO$_2$ | S |
| Control 1 | | 15 | SiO$_2$ | F |
| Example 6 | 4 | 16 | SiO$_2$ | S |
| Example 7 | 4 | 16 | Si$_3$N$_4$ | S |
| Example 8 | 4 | 14 | SiO$_2$ | S |
| Example 9 | 4 | 14 | Si$_3$N$_4$ | S |
| Example 10 | 4 | 13 | SiO$_2$ | S |
| Example 11 | 4 | 13 | Si$_3$N$_4$ | P |
| Example 12 | 4 | 12 | SiO$_2$ | S |
| Example 13 | 4 | 12 | Si$_3$N$_4$ | P |
| Example 14 | 4 | 11 | SiO$_2$ | S |
| Example 15 | 4 | 11 | Si$_3$N$_4$ | F |
| Example 16 | 4 | 10 | SiO$_2$ | S |
| Example 17 | 4 | 10 | Si$_3$N$_4$ | F |
| Control 2 | 4 | 9 | SiO$_2$ | P |
| Control 3 | 4 | 9 | Si$_3$N$_4$ | F |
| Control 4 | 4 | 8 | SiO$_2$ | F |
| Control 5 | 4 | 8 | Si$_3$N$_4$ | F |

When the process of heat treatment embraced a step of heat treatment performed under the conditions of not less than 1250° C. in temperature, not less than 5% in oxygen flow rate during the heat treatment, and not less than 10 minutes in the time of heat treatment, the step between the SOI/bulk regions which occurred when the aforementioned step was not embraced was eliminated. (Incidentally, FIG. 3 illustrates a phase diagram of flow rate—treating temperature.) At each of the points indicated by the empty circle, o, a step exceeding 200 nm was observed and at each of the points indicated by the filled circle, ●, a step exceeding 200 nm was not observed.

Although only a few embodiments of the present invention have been shown and described, it is to be understood that many changes and modifications may be made thereunto without departing from the spirit and scope of the invention as defined in the appended claims.

What is claimed is:

1. A method of producing a semiconductor substrate of single crystal silicon having a buried silicon compound partial film, said method comprising the steps of:
   a) forming an ion implantation mask on a surface of a single crystal silicon substrate;
   b) implanting non-silicon atoms beneath the surface of the single crystal silicon substrate by ion implantation through the mask in a direction not perpendicular to the surface of the single crystal silicon substrate, wherein at least two angles are formed between a projection of the flux of ion implantation and a specific azimuth of the substrate; and
   c) heat treating the substrate at a temperature of not less than 1250° C. for not less than ten minutes.

2. The method of claim 1 wherein said silicon compound comprises silicon oxide, said non-silicon atoms comprise oxygen atoms, and said heat treating takes place in an atmosphere having an oxygen flow rate of not less than 5%.

3. The method of claim 1, wherein the angle the projection of flux makes with a normal to the single crystal silicon substrate surface is at least 10°.

4. The method of claim 1, wherein the angle the projection of flux makes with a normal to the single crystal silicon substrate surface is from 11° to 16°.

5. The method of claim 1, wherein a first ion implantation is made at a first angle to the azimuth, and an ion implantation device and the substrate are moved relative to each other, and a second ion implantation is made at a second angle to the azimuth.

6. The method of claim 1, wherein heat treatment takes place in an oxygen-containing atmosphere at a temperature of from about 1300° C. to about 1350° C.

7. The method of claim 1, wherein said mask comprises silicon oxide.

8. The method of claim 1, wherein the buried film is not exposed at the surface of the single crystal silicon substrate.

9. The method of claim 1, wherein the thickness difference between portions of the substrate having a buried film and portions of the substrate having no buried film is 200 nm or less.

10. The method of claim 8, wherein the thickness difference between portions of the substrate having a buried film and portions of the substrate having no buried film is 200 nm or less.

11. The method of claim 1, wherein said heat treatment begins with an atmosphere having a 0.5% concentration of oxygen, followed by an increase in oxygen concentration to 70%, said percentages being percentage by volume.

12. The process of claim 11, which takes place at a temperature of not less than 1325° C.

13. A method of producing a semiconductor substrate of single crystal silicon having a buried silicon oxide partial film, said method comprising the steps of:

a) forming an ion implantation mask on a surface of a single crystal silicon substrate;

b) implanting oxygen atoms beneath the surface of the single crystal silicon substrate by ion implantation through the mask in a direction not perpendicular to the surface of the single crystal silicon substrate, wherein at least two angles are formed between a projection of the flux of ion implantation and a specific azimuth of the substrate; and c) heat treating the substrate at a temperature of not less than 1250° C. for not less than ten minutes, at least a portion of said heat treating taking place in an atmosphere containing oxygen.

14. The method of claim 13, wherein the angle the projection of flux makes with a normal to the single crystal silicon substrate surface is from 11° to 16°.

15. The method of claim 13, wherein the buried film is not exposed at the surface of the single crystal silicon substrate.

16. The method of claim 13, wherein the thickness difference between portions of the substrate having a buried film and portions of the substrate having no buried film is 200 nm or less.

17. The method of claim 15, wherein the thickness difference between portions of the substrate having a buried film and portions of the substrate having no buried film is 200 nm or less.

* * * * *